(12) United States Patent
Bao et al.

(10) Patent No.: US 6,582,755 B2
(45) Date of Patent: Jun. 24, 2003

(54) POLARIZABLE PHOTOACTIVE AND ELECTROACTIVE POLYMERS AND LIGHT EMITTING DEVICES

(75) Inventors: Zhenan Bao, North Plainfield, NJ (US); Karl R. Amundson, Cambridge, MA (US); Xiaochen Linda Chen, Parsipanny, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/138,319

(22) Filed: May 6, 2002

(65) Prior Publication Data

US 2002/0161153 A1 Oct. 31, 2002

Related U.S. Application Data

(62) Division of application No. 09/377,879, filed on Aug. 19, 1999, now Pat. No. 6,383,665.

(51) Int. Cl.[7] .................................................. B05D 5/12
(52) U.S. Cl. ........................... 427/64; 427/66; 428/690; 428/917; 528/397; 528/425
(58) Field of Search ...................... 427/64, 66; 428/690, 428/917; 528/397, 425

(56) References Cited

U.S. PATENT DOCUMENTS

| | | |
|---|---|---|
| 3,532,643 A | 10/1970 | Wessling et al. |
| 3,706,677 A | 12/1972 | Wessling et al. |
| 5,247,190 A | 9/1993 | Friend et al. |
| 5,700,696 A | 12/1997 | Chandross et al. |
| 5,705,888 A | 1/1998 | Staring et al. |
| 5,753,757 A | 5/1998 | Hsieh |
| 5,869,350 A | 2/1999 | Heeger et al. |
| 5,876,865 A | 3/1999 | Hsieh |

OTHER PUBLICATIONS

Bao et al. Poly(phenylenevinylene)s with Dendritic Side Chains: Synthesis, Self–Ordering, and Liquid Crystalline Properties, Macromolecules (1998), 31(24), 8647–8649.*

Andrea Montali et al., *Polarizing energy transfer in photoluminesent materials for display applications*, Nature, vol. 392, pp. 261–264, Mar. 1998.

Birol Karakaya et al., *Toward Dendrimers with Cylindrical Shape in Solution*, J. Am. Chem. Soc. vol. 119, pp. 3296–3301, 1997.

M. Breggren, *Light amplification in organic thins films using cascade energy transfer,* Nature/vol. 389, pp. 446–449, Oct. 2, 1997.

Lars Onsager, *The Effects of Shape on the Interaction of Colloidal Particles,* Annals of the New York Academy of Sciences, vol. 51, Art. 4, pp. 627–659, May 31, 1949.

Vera Cimrova et al., *Polarized Light Emission from LEDs Prepared by the Langmuir–Blodgett Technique,* Advance Materials, vol. 8, No. 2, pp. 146–149, 1996.

Christopher Weder et al., *Highly Polarized Luminescence from Oriented Conjugated Polymer/Polyethylene Blend Films,* Advance Materials, vol. 9, No. 13, pp. 1035–1039, 1997.

(List continued on next page.)

*Primary Examiner*—Duc Truong

(57) ABSTRACT

The invention relates to poly(phenylene vinylene) polymers substituted with dendritic sidechains to enhance main-chain separation in the solid state. The polymers are synthesized by the Heck polymerization and have a weight-average molecular weight of 20,000 to 60,000 Daltons. The polymers are self-ordering in the solid state and have thermotropic liquid crystalline phases. The polymers show enhanced photoconductivity, better charge transport capability and improved polarized light emission.

37 Claims, 6 Drawing Sheets

OTHER PUBLICATIONS

Virgil Percec et al., *Fluorophobic Effect Induces the Self-Assembly of Semifluorinated Tapered Monodendrons Containing Crown Ethers into Supramolecular Columnar Dendrimers Which Exhibit a Hometropic Hexagonal Columnar Liquid Crystalline Phase,* J. Am. Chem. Soc., vol. 118, pp. 9655–9866, 1996.

Zhonghua Peng, *Synthesis and Characterization of Photorefractive Polymers Containing Transition Metal Complexes a Photosensitizer,* J. Am. Chem. Soc., vol. 119, pp. 4622–4632, 1997.

Zhenan Bao, et al., *Conjugated Liquid Crystalline Polymers–Soluble and Fusible Poly(phenylenevinylene) by the Heck Coupling Reaction,* Macromolecules, vol. 26, 1993.

* cited by examiner

2θ°

2θ°

2θ°

POLARIZABLE PHOTOACTIVE AND ELECTROACTIVE POLYMERS AND LIGHT EMITTING DEVICES

The application is a divisional of U.S. patent application Ser. No. 09/377,879, now U.S. Pat. No. 6,383,665, entitled POLARIZABLE PHOTOACTIVE AND ELECTROACTIVE POLYMERS AND LIGHT EMITTING DEVICES, filed on Aug. 19, 1999, the entirety of which is hereby incorporated by reference.

BACKGROUND OF THE INVENTION

1. Field of the Invention

The present invention relates to electroluminescent and photoluminescent polymer compositions and processes for their preparation and use in, for example, electroluminescent devices such as electroluminescent displays and liquid crystal displays.

2. Description of the Related Art

Electroluminescent (EL) devices are structures which emit fight when subject to an applied electric field. The usual model for the physical process in a semiconductor used in this way is through the radiative combination of electron-hole pairs which are injected into the semiconductor from opposite electrodes. Common examples are light-emitting diodes based on Gap and similar III–V semiconductors. Though these devices are efficient and widely used, they are limited in size, and are not easily or economically used in large area displays. Alternative materials which can be prepared over larger areas are also known. Among the inorganic semiconductors, most effort has been directed to ZnS, which has considerable practical drawbacks and primarily poor reliability. The mechanism in ZnS is believed to be one in which acceleration of one type of carrier through the semiconductor under a strong electric field causes local excitation of the semiconductor which relaxes through radiative emission.

Among organic materials, simple aromatic molecules such as anthracene, perylene and coronene are known to show electrolumninescence. The practical difficulty with these materials is, as with ZnS, their poor reliability, together with difficulties in deposition of the organic layers and the current-injecting electrode layers. Techniques such as sublimation of the organic material suffer from the disadvantage that the resultant layer is soft, prone to recrystallization, and unable to support high temperature deposition of top-contact layers. Techniques such as Langmuir-Blodgett film deposition of suitably-modified aromatics suffer from poor film quality, dilution of the active material, and high cost of fabrication.

Solid-state light-emitting diodes (LEDs) have found widespread application in displays, as well as in a variety of other applications. LEDs are typically fabricated from conventional semiconductors, for example, gallium arsenide (GaAs), typically doped with aluminum, indium, or phosphorus. Using this technology, however, it is very difficult to make large area displays. In addition, the LEDs made of these materials are typically limited to the emission of light at the long wavelength end of the visible spectrum. For these reasons, there has been considerable interest for many years in the development of suitable organic materials for use as the active (light-emitting) components of LEDs. The utilization of semiconducting organic polymers (i.e., conjugated polymers) in the fabrication of LEDs expands the use of organic materials in electroluminescent devices with the possibility of significant advantages over existing LED technology.

Among the most recent discoveries was the discovery that conjugated polymers are particularly well suited for this purpose in that they provide excellent charge transport characteristics and useful quantum efficiencies for luminescence. Conjugated polymers are an important class of light emitting polymers for electroluminescent (EL) devices. A conjugated polymer is a polymer which possesses a delocalised π-electron system along the polymer backbone; the delocalised π-electron system confers semiconducting properties to the polymer and gives it the ability to support positive and negative charge carriers with high mobilities along the polymer chain. Such polymers are discussed, for example, by K H. Friend in Journal of Molecular Electronics 4 (1988) January–March, No. 1, pages 37 to 46. The most popular of the materials suitable for this use is poly (phenylene vinylene) (PPV) which is capable of being prepared in the form of a high quality film which evidences strong photoluminescence in a band centered near 2.2 eV.

There are two principal approaches to the fabrication of conjugated polymer thin films, namely, the precursor approach and the side chain approach. The former relies on the preparation of a soluble precursor polymer which can be cast into thin films. The precursor polymer can then be converted to the final conjugated polymer films through solid-state thermo- or photo-conversion. Friend et al., refers to EL devices based on poly(p-phenylene vinylene) (PPV) thin films derived from a sulfonium precursor route, see, e.g., U.S. Pat. No. 5,247,190, issued Sep. 21, 1983, to Friend et al. Friend et al. also refers to an electroluminescent device having a semiconductor layer in the form of a thin dense polymer film including at least one conjugated polymer, a first contact layer in contact with a first surface of the semiconductor layer, and a second contact layer in contact with a second surface of the semiconductor layer. The polymer film of the semiconductor layer has a sufficiently low concentration of extrinsic charge carriers that, on applying an electric field between the first and second contact layers across the semiconductor layer so as to render the second contact layer positive relative to the first contact layer, charge carriers are injected into the semiconductor layer and radiation is emitted from the semiconductor layer. The polymer film can be a poly(p-phenylene vinylene) wherein the phenylene ring may optionally carry one or more substituents each independently selected from alkyl, alkoxy, halogen or nitro.

What is needed is a dendritic polymer, specifically a poly(phenylene vinylene) polymer for use in an electroluminescent device, which polymer is self-ordering in the solid state, has thermotropic liquid crystalline phases, enhanced photoconductivity, better charge transport capability, and improved polarized light emission over prior poly(phenylene vinylene) polymers.

SUMMARY OF THE INVENTION

The present invention relates to dendritic polymer such as a poly(phenylene vinylene) polymer having dendritic sidechains. The dendritic sidechains enhance the main-chain poly(phenylene vinylene) separations in the solid state. The poly(phenylene vinylene) polymers according to the present invention may be synthesized using, e.g., the Heck polymerization method to achieve a resultant weight-average molecular weight of from about 20,000 to about 60,000 Daltons. The polymers are self-ordering in the solid state, have thermotropic and lyotropic liquid crystalline phases and show enhanced photoluminescence efficiency and polarized light emission over prior poly(phenylene vinylene) polymers.

The present invention also provides processes for preparing soluble poly(phenylene vinylene) polymers having dendritic side chains, which polymers are self-ordering in the solid state, have thermotropic liquid crystalline phases, enhanced photoconductivity, better charge transport capability, and improved polarized light emission.

The above and other advantages and features of the invention will be more clearly understood from the following detailed description together with the accompanying drawings.

DETAILED DESCRIPTION OF PREFERRED EMBODIMENTS

Figure 1:
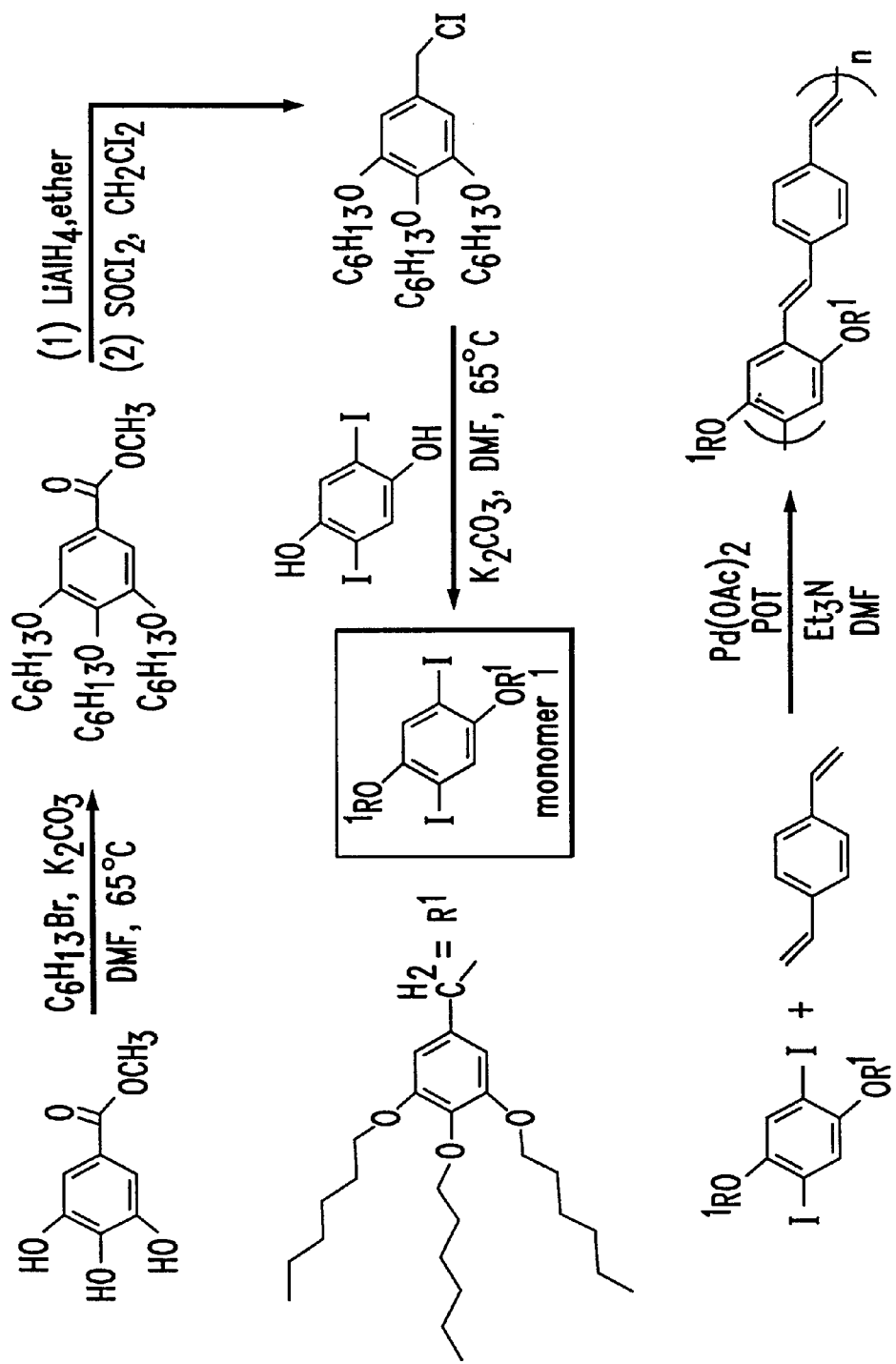
FIG. 1 shows a reaction scheme for a polymer according to a first embodiment of the present invention.

Reference will now be made in detail to the preferred embodiments of the invention, which, together with the drawings and the following examples, serve to explain the principles of the invention. These embodiments are described in sufficient detail to enable those skilled in the art to practice the invention, and it is to be understood that other embodiments may be utilized, and that structural and chemical changes may be made without departing from the spirit and scope of the present invention.

An electroluminescent material is a material which emits light upon application of an electric field. A photoluminescent material is a material which emits light upon excitation by light. Polarized electroluminescence and photoluminescence occur when the material has macroscopic ordering (molecules are aligned in a direction) so as to generate polarized light. Polarized light sources are useful in the fabrication of brighter liquid crystal displays.

Liquid crystallinity is a state between crystalline solid phase and isotropic liquid phase. In this state, the molecules are not positionally ordered as in a crystal, but they spontaneously align with neighboring molecules, giving long-range orientational order. This long-range orientational order facilitates macroscopically aligning the material by various means.

A material may be ordered macroscopically in many ways. For example, if a material is a liquid crystalline material, it can be aligned in the liquid crystalline state by shear force, electric field, or magnetic field. If a material is not liquid crystalline, it can be aligned by mechanical stretching, blending with another material, dissolving in a solvent and spread to form a monolayer film, or by self assembly. In order for a material to be ordered by mechanical stretching, the material must have high mechanical strength. Otherwise, the material tends to break and the thickness of the material is difficult to maintain at a uniform thickness. Also, alignment by mechanical stretching requires that the material be cooled quickly so that it does not relax from the aligned state.

Macroscopic ordering may also be achieved by mixing the material with another stretchable polymer, such as polyethylene. However, such a blend generally cannot be used for electroluminescent devices since the matrix polymer is typically an insulator. A third way to achieve macroscopic ordering is by dissolving the material in a solvent and spreading to form a monolayer film, also known as the Langmuir-Blodgett technique. The material can be dissolved in an organic solvent and the solution can be spread on a surface to form a monolayer film. This film can then be compressed by a blade to align molecules in the film. Eventually, the aligned film can be transferred to a substrate. The drawback of this method is that it requires the material to be amphiphilic. In addition, the technique itself is tedious and only a small area of film can be made.

Materials can also be ordered by forming self-assembling materials which self order themselves and form a macroscopically ordered film. For this method special molecules have to be designed and synthesized.

The primary factor in determining whether a substance exhibits liquid crystallinity is molecular shape. For example, rod-like molecules are commonly found to exhibit liquid crystal phases. A seminal theory for the formation of liquid crystal nematic phases was developed by Lars Onsager in his paper "The Effects of Shape on the Interaction of Colloidal Particles" in the Annals of the New York Academy of Sciences, vol. 51, Art. 4, pp. 627–659 (1949). Onsager considered rod-like molecules in a solution with no thermal interactions, only steric repulsions between the rods. The rods have a diameter D and length L. Onsager predicted a liquid crystalline phase when the aspect ratio L/D is sufficiently large. Based on a summary of Onssager's theory given in the book "The Theory of Polymer Dynamics" by M. Doi and S. F. Edwards (Oxford: Belfast) 1986, the ratio L/D should-be over about four in a solution of pure rod-like molecules. In the polymers according to the present invention, the molecular architecture is more like a rigid rod with regularly attached bulky spheroids on the sides. Including the spheroids in an estimate for the effective diameter and taking into account the average molecular weight for the polymers synthesized according to the present invention, the polymers have an L/D of about 3. Thus, it would not be expected based upon Onsager's theory that the polymers of the present invention would exhibit liquid crystallinity.

Rigid-rod conjugated polymers with long alkyl chains can also have liquid crystallinities. The advantage of rigid-rod conjugated polymers with dendritic side chains over rigid-rod conjugated polymers with long alkyl chains is that the melted liquid of conjugated polymers with dendritic side chains tend to be less viscous. Since the viscosity of a polymer is usually a function of its molecular weight, the sidechains of the conjugated polymer can act as a solvent or lubricant and thus reduce the viscosity of the polymer. With the same backbone molecular weight, the more sidechains the polymer has, the less viscous it is, and the easier for it to be aligned in the liquid crystalline state. Lyotropic liquid crystalline state is found with a solution of a soluble molecule at a certain temperature and concentration range. Usually, high solution concentration is needed to form lyotropicliquid crystals. Rigid-rod conjugated polymers with linear alkyl chains do not have sufficient solubility to form lyotropic liquid cystalline polymers. However, with dendritic sidechains, these polymers are soluble in organic solvents and lyotropic liquid crystalline phases were found. These types of poylmers may also be sheared in the lyotropic liquid crystalline phases from a solution.

Also, more functional groups can be attached as sidechains since dendrimers have many branches for functionalizations. This property is useful for photoluminescence. For example, if the polymer has an architecture having a rod backbone with several dendritic chains, the dendritic chain elements can absorb light at a first wavelength and transfer the energy to the backbone which may then emit light at a longer wavelength. If the concentration of the backbone is low (less than 5%), the optical loss due to absorption of the dendritic chains will be low since the second wavelength is shifted away from the strong absorption edge of the dendritic sidechains. See, M. Berggren et al., Light Amplification in Organic Films using Cascade Energy Transfer, 389 Nature 466–69 (1997).

Poly(phenylene vinylene) polymers and derivatives have many applications as active materials in optoelectronic devices. PPV without any substituents is insoluble in organic solvents and is usually processed from its precursor polymer by a conversion reaction. Various sidechains can be attached to the PPV backbone to render it soluble and processable. Commonly used sidechains are simple linear alkyl and alkoxy substituents. These polymers are classified as "hairy rod" polymers and have been found to be thermotropic liquid crystals. However, these types of polymers tend to form aggregates and result in low photoluminescence and electroluminescence quantum efficiencies due to aggregation quenching. To solve this problem, branched chains, such as 2-ethylhexyloxy in poly(2-methoxy-5-(2-ethylhexyloxy)phenylene vinylene) (MEH-PPV), and bulky substituents have been used. Other approaches involve the formation of nano-sized PPV domains by self-assembly or use of liquid crystals as templates. In addition, dilution of PPV chromophores using block copolymers or polymer blends and deliberate inclusion of cis PPV are effective methods.

In the present invention, the synthesis and structue of branched and hyperbranched (dendritic) sidechain substituted PPVs are used to enhance main-chain PPV separations in the solid state. The dendritic substituent according to the present invention may be an aromatic etheral moeity with one or a plurality of substituent having $C_6$–$C_{12}$ alkyl groups. Interestingly, these polymers were found to exhibit thermotropic liquid crystalline order. Liquid crystallinity can be used to form highly ordered photoluminescent films for generating polarized light. Specific examples of dendritic PPV's according to the present invention include:

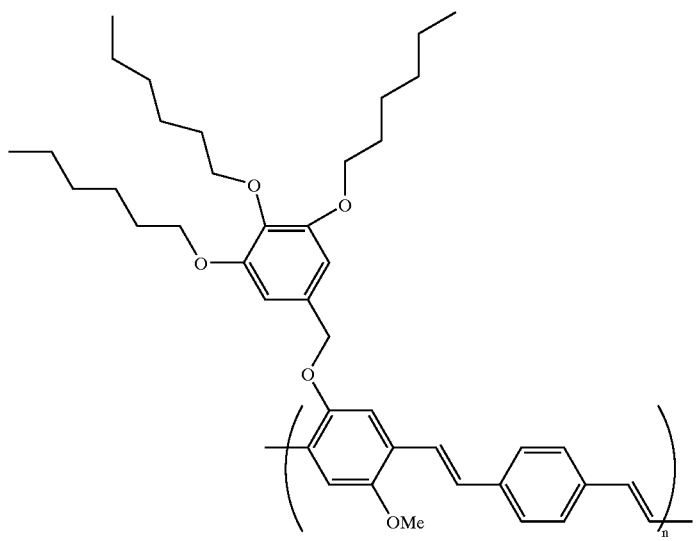

-continued
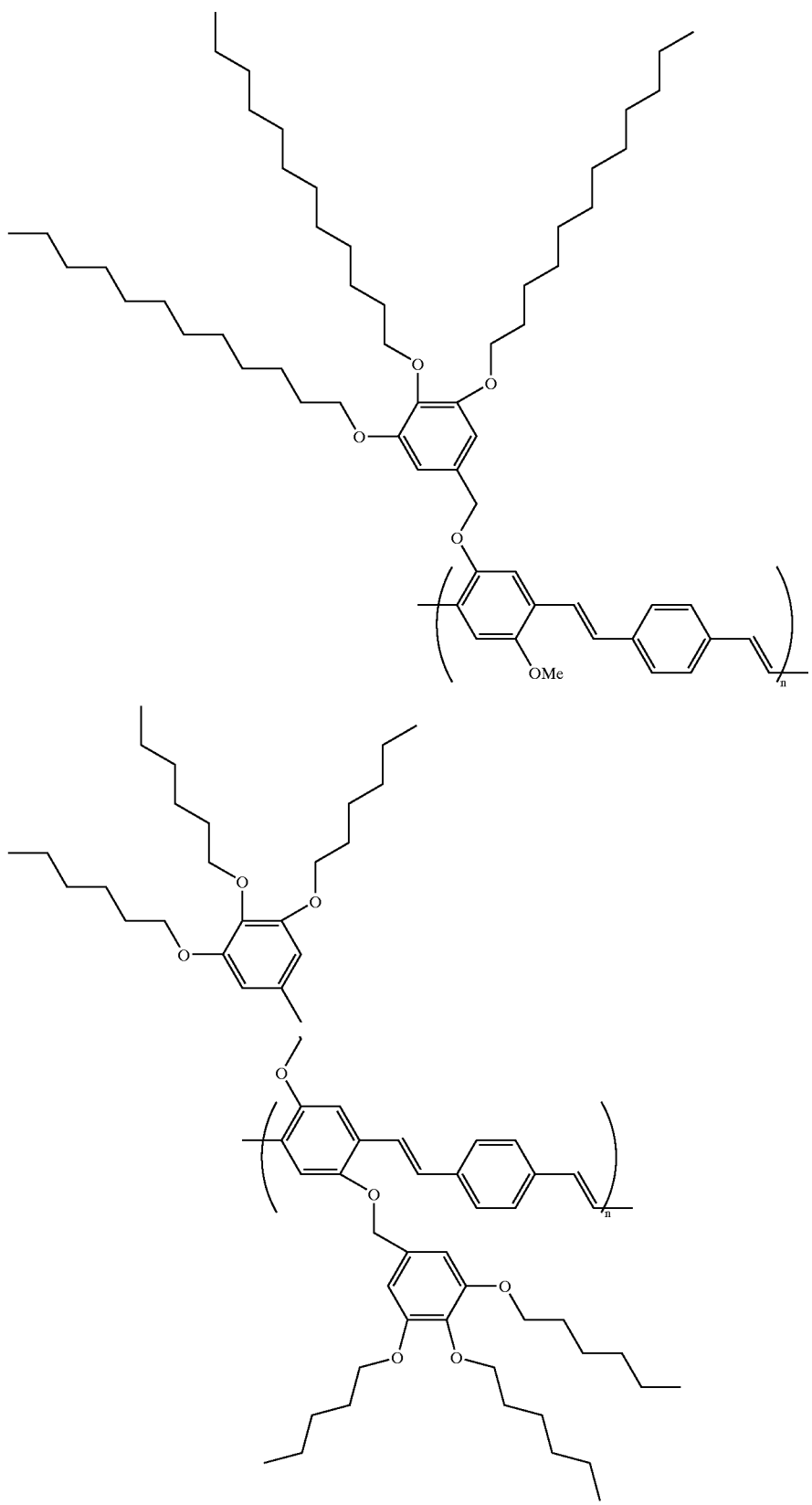

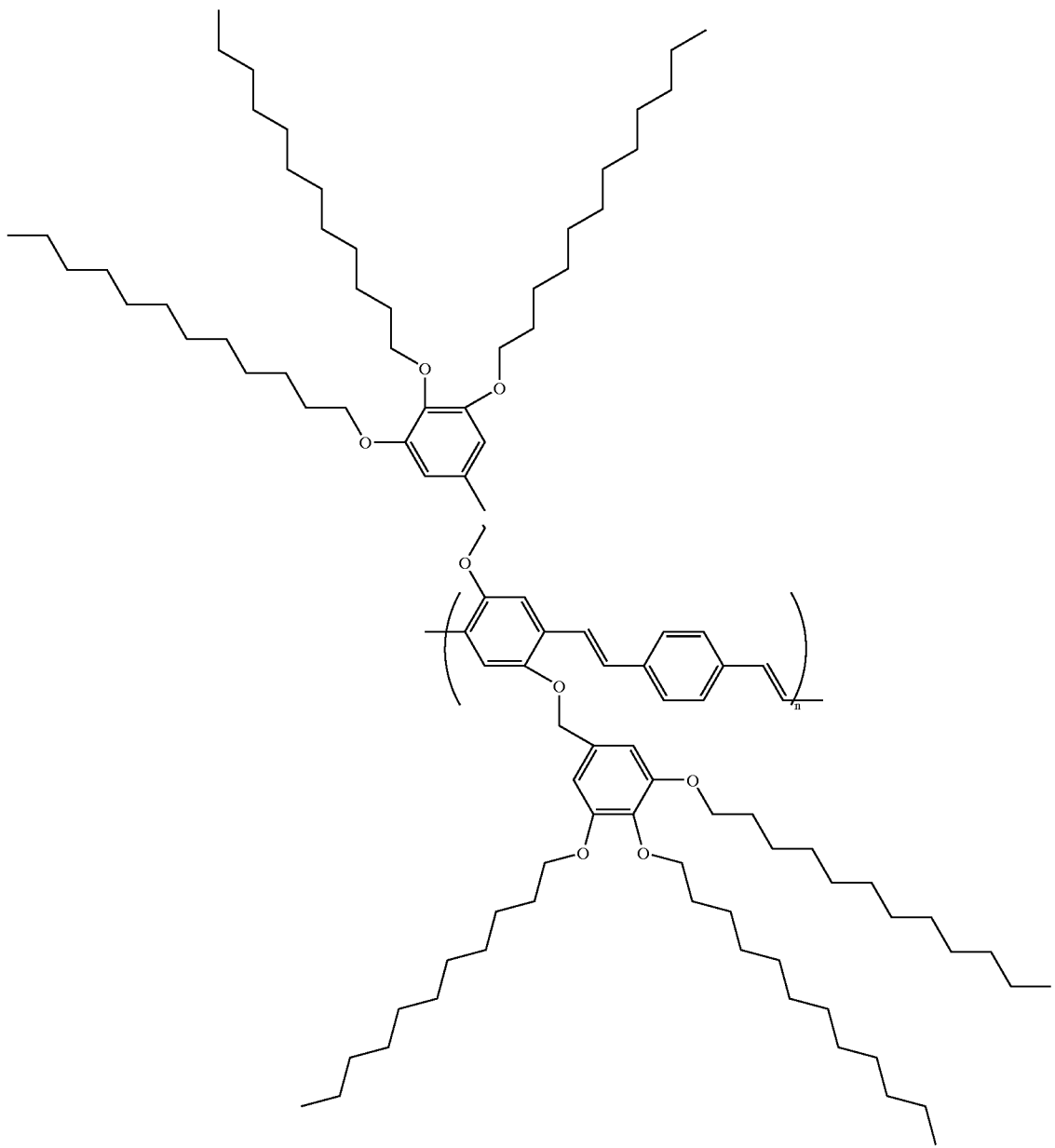

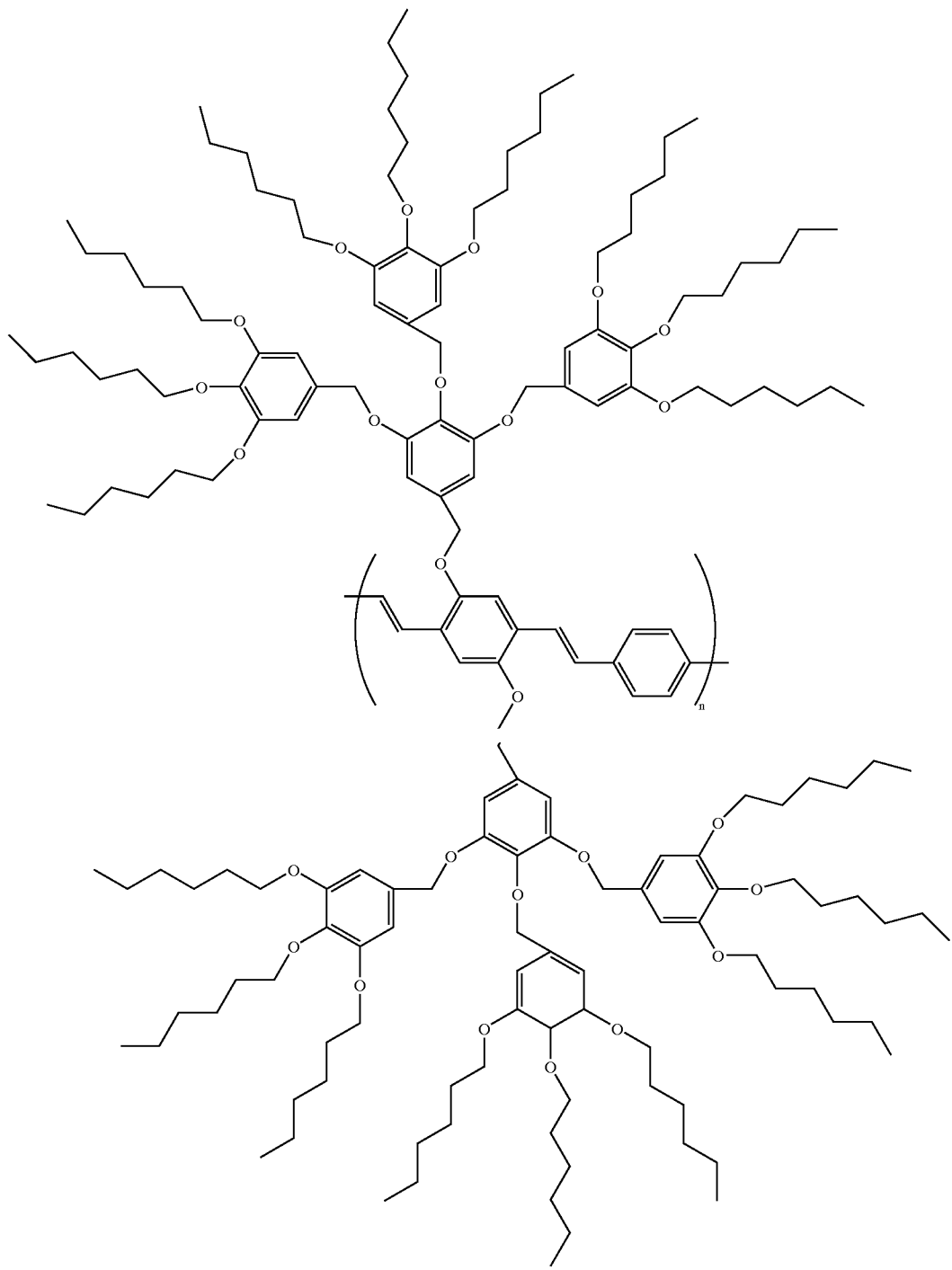

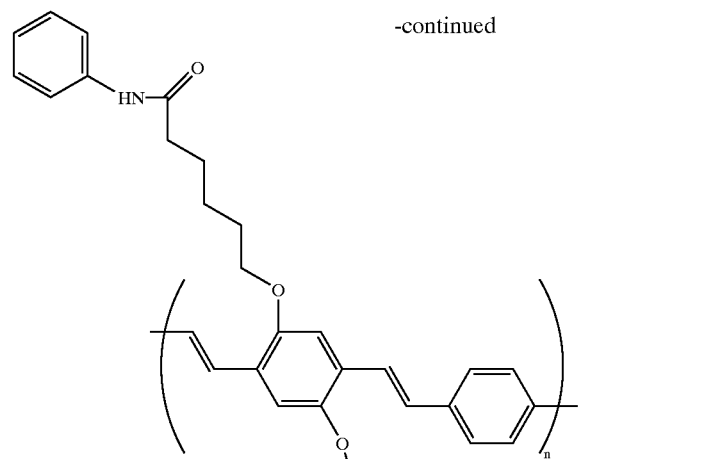
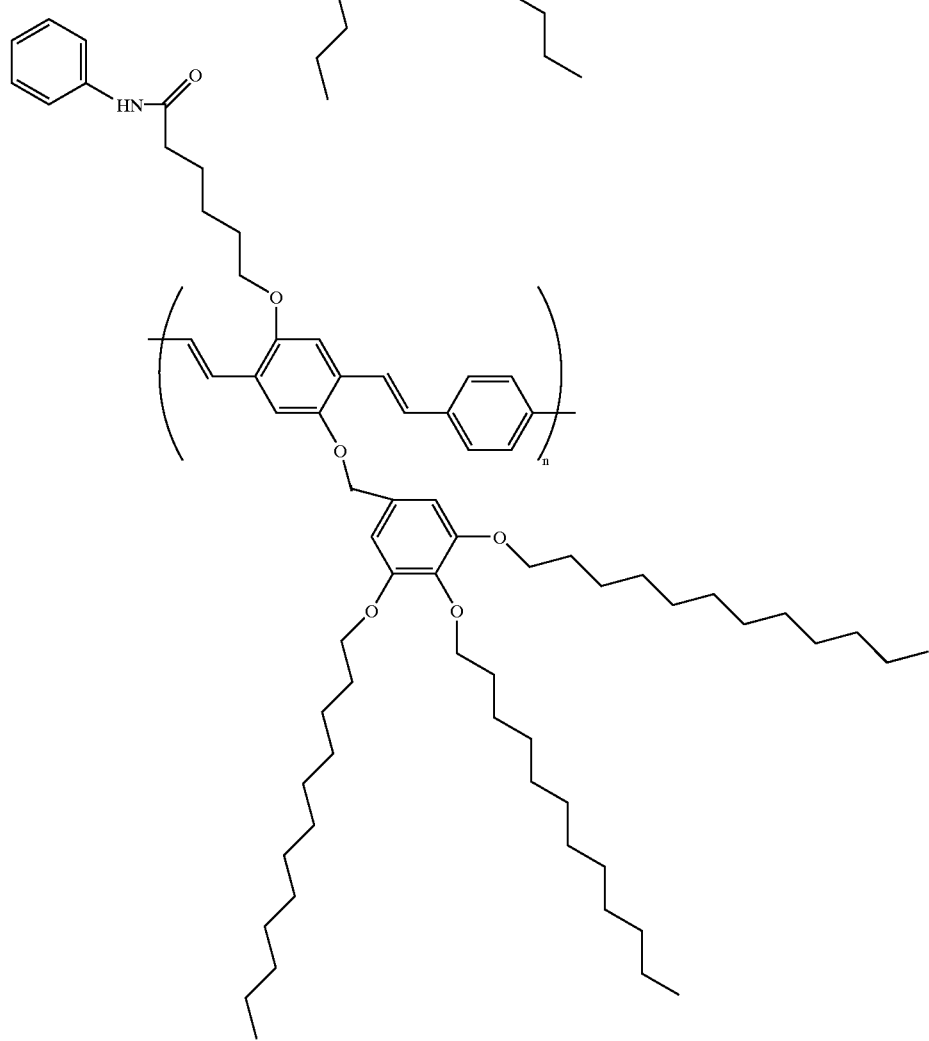

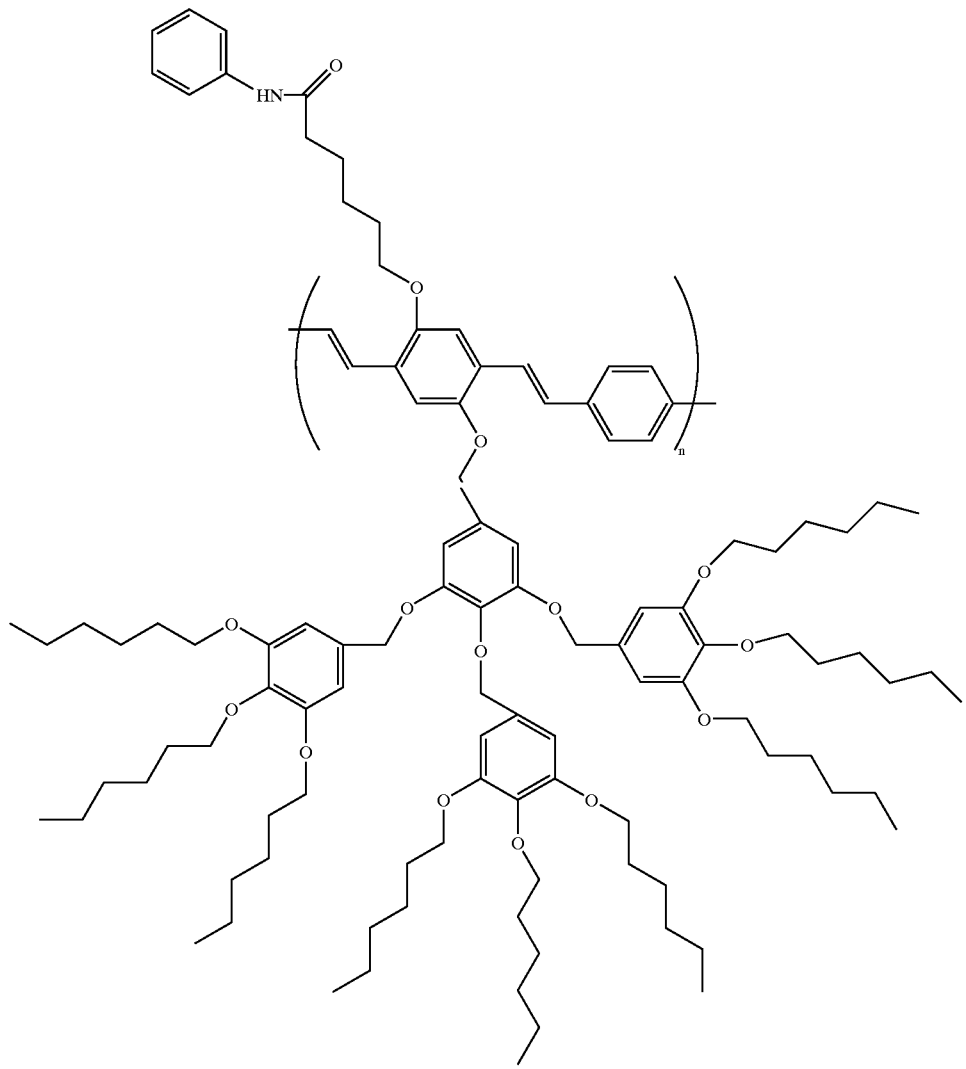
The dendritic polymers of the present invention a repeating unit of the formula:
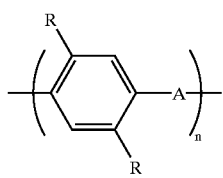
wherein A is selected from the group consisting of,
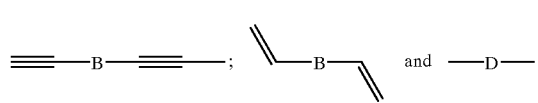
wherein B is selected from the following:
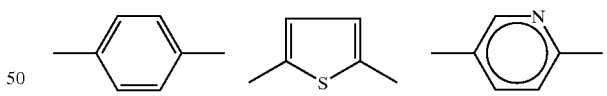
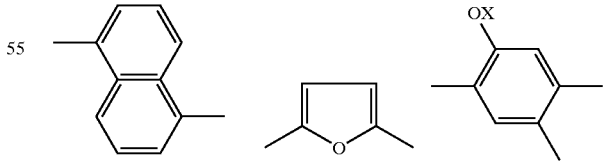
wherein X is a dendritic substituent or a methyl group;
wherein D is selected from:
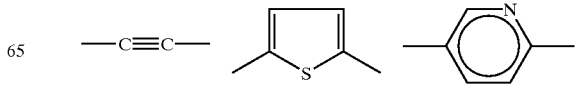

-continued

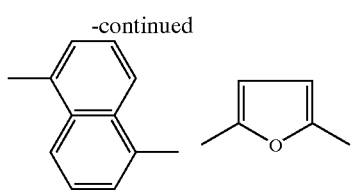

and where R may be a dendritic substutuent, an alkyl substituent and/or an alkoxy substituent provided that at least one R is a dendritic substituent. Preferred dendritic substituents include $R^1$, $R^2$ and $R^3$, wherein $R^1$ is a compound of the formula:

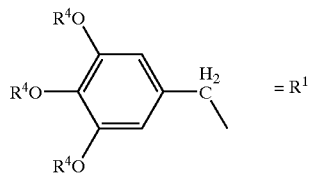

and $R^2$ is a compound of the formula:

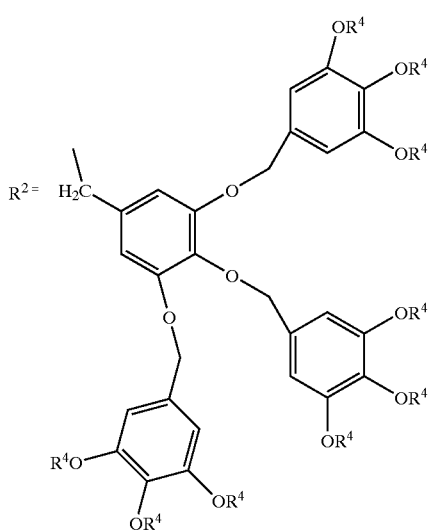

and $R^3$ is a compound of the formula:

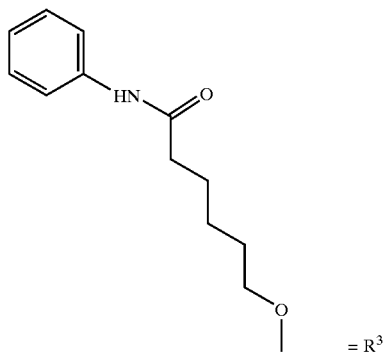

where n is an integer from about 5 to about 25 and $R^4$ is any $C_2$–$C_{18}$ alkyl group. Preferably, n is an integer from about 10 to about 20, most preferably about 15. $R^4$ is independently selected depending upon the desired physical characteristics of the molecule. $R^4$ may be a branched or straight chain group. In particular, $R^4$ is preferably a $C_6$–$C_{12}$ alkyl group, most preferably an n–$C_6$ or an n–$C_{12}$ alkyl group.

Figure 2:
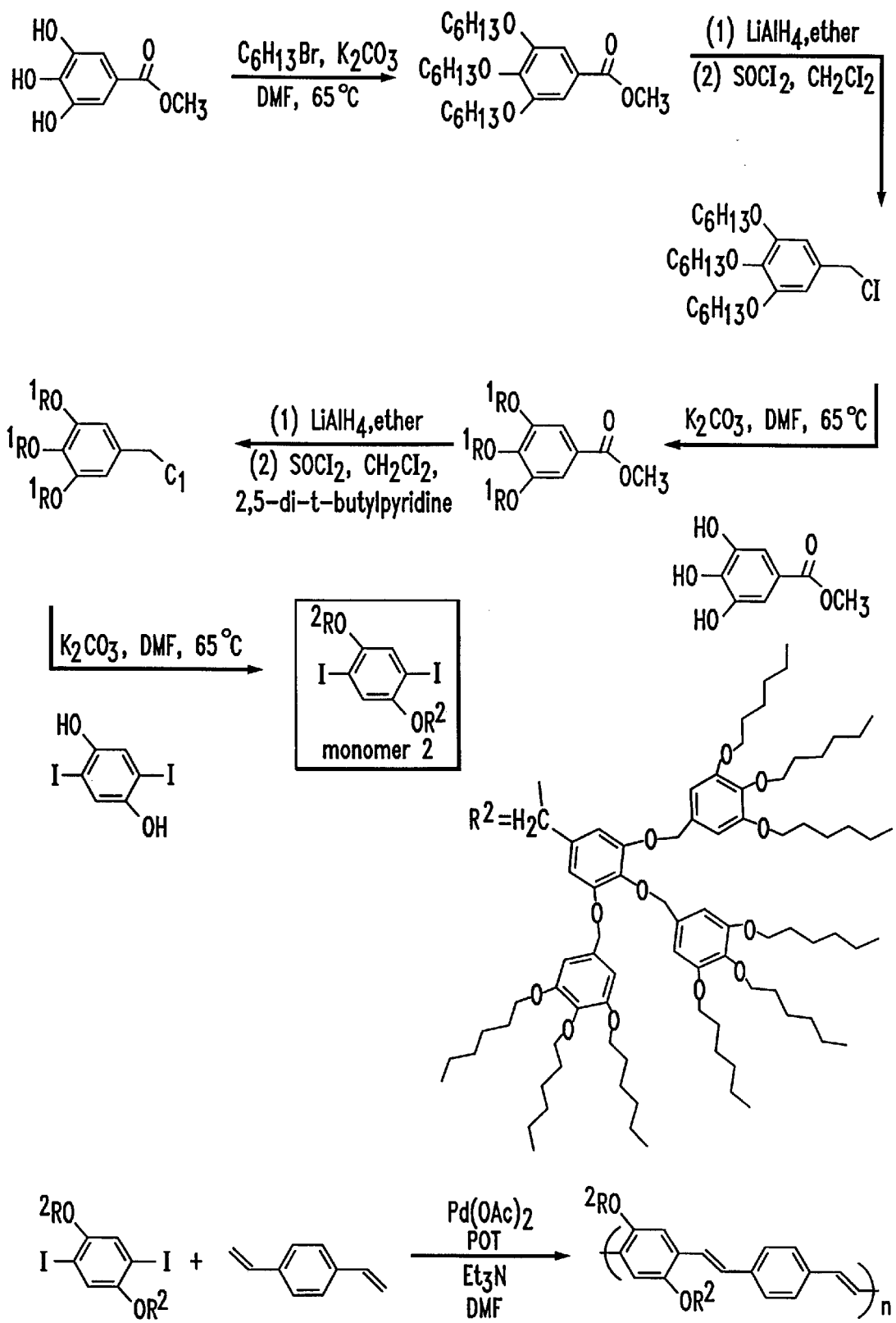
FIG. 2 shows a reaction scheme for a polymer according to a second embodiment of the invention.

An exemplary synthesis of a dendritic sidechain PPV is shown with reference to FIGS. 1 and 2. Percec et al., 118 J. Am. Chem. Soc. 9855, 1996 describes a basic method for fabrication of PPV's and is herein incorporated by reference.

Reference is now made to FIG. 1. Methyl-3,4,5-trihydroxybenzoate was chosen as the core for building up the dendritic sidechains since highly branched molecules can be formed from methyl-3,4,5-trihydroxybenzoate even at low yield.

As shown with reference to FIG. 1, the methyl-3,4,5-trihydroxybenzoate is reacted with n-hexyl bromide and potassium carbonate in the presence of dimethyl formamide (DMF) at 65° C. The reaction results in a methyl-3,4,5-trihexyl ether benzoate intermediate product as shown below.

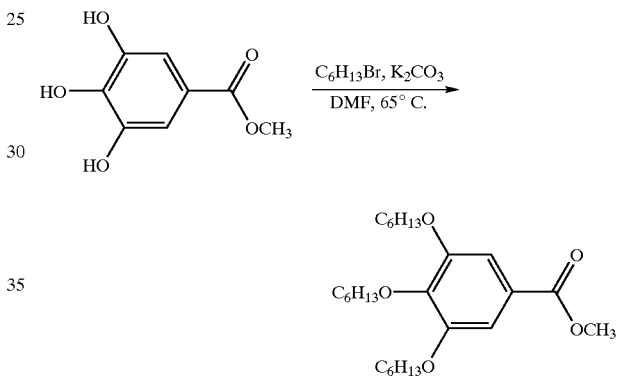

The intermediate methyl-3,4,5-trihexyl ether benzoate is then reacted with etheral lithium aluminum hydrate at a temperature of about 0° C. followed by thionyl chloride and dichloromethane at a temperature of about 25° C. to form a 3,4,5-trihexyl-methylbenznyl chloride intermediate as shown below.

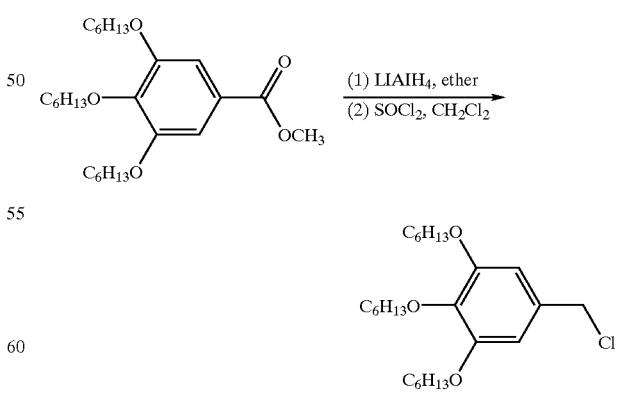

The intermediate ,4,5-trihexyl-methylbenznyl chloride is then reacted with 2,5-diiodo hydroquinone in the presence of potassium carbonate and DMF at 65° C. to form monomerl.

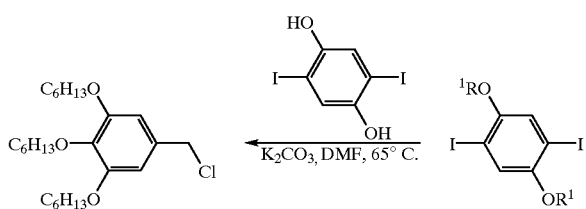

monomer 1 where R¹ is

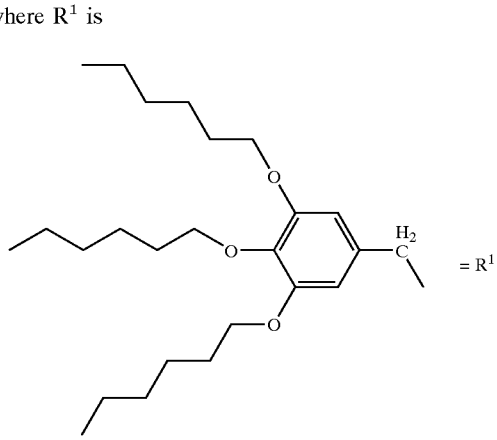

The palladium-catalyzed Heck reactions are used for the polymerizations. See, Heck, R. F. *Org. React.* 1982. More specifically, monomer1 is then reacted with divinyl benzene in the presence of palladium diacetate, POT, triethyl nitrate and DMF at a temperature of about 100° C. to form polymer1 (PPVD1) as shown below

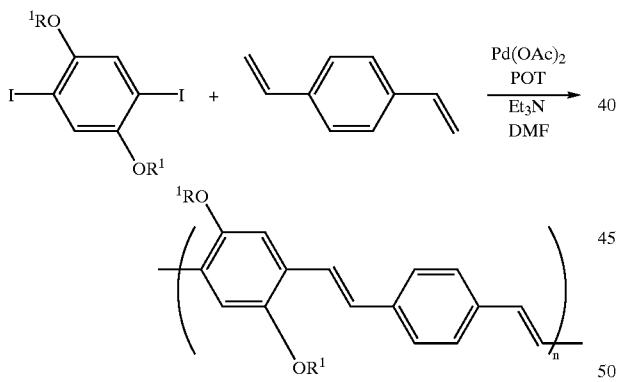

where n is from about 5 to about 25, preferably about 15 and where R¹ is of the formula set forth above. The Heck reaction was previously found to have side-reactions in which both the 1 and 2-position of the vinyl group can react with phenyl halides with much lower reactivity at the 2-position. In the present invention, due to this side-reaction the vinyl groups were not visible in ¹H NMR Subsequent observations of self-ordering and liquid crystalline properties of this polymer indicate that few structural defects exist.

Reference is now made to FIG. 2. A polymer according to a second embodiment of the invention is formulated according to the reaction scheme set forth in FIG. 2. Again, methyl-3,4,5-trihydroxybenzoate was chosen as the core for building up the dendritic sidechains since highly branched molecules can be formed from methyl-3,4,5-trihydroxybenzoate even at low yield.

The methyl-3,4,5-trihydroxybenzoate is reacted with n-hexyl bromide and potassium carbonate in the presence of dimethyl formamide (DMA) at 65° C. The reaction results in a methyl-3,4,5-trihexyl ether benzoate intermediate product as shown below.

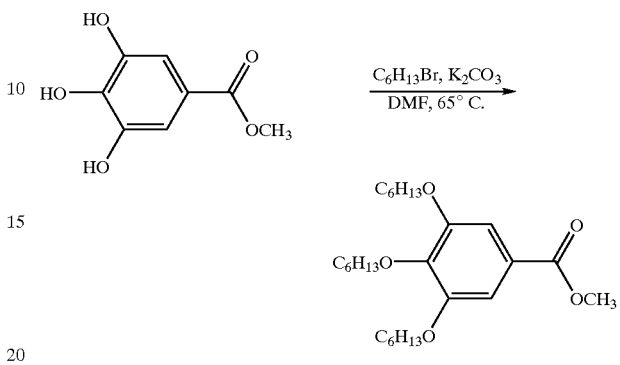

The intermediate methyl-3,4,5-trihexyl ether benzoate is then reacted with etheral lithium aluminum hydrate at a temperature of about 0° C. followed by thionyl chloride and dichloromethane at a temperature of about 25° C. to form a 3,4,5-trilheql-methylbenznyl chloride intermediate as shown below.

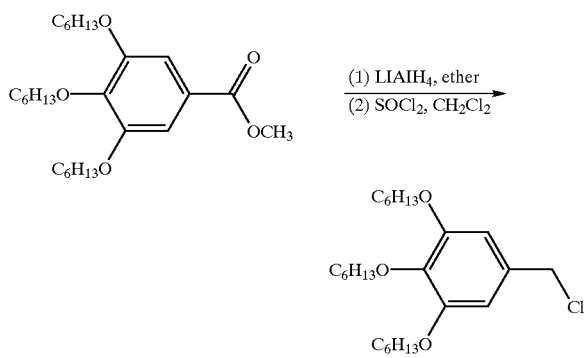

The intermediate ,4,5-trihexyl-methylbenznyl chloride is then reacted with methyl-3,4,5-trihydroxybenzoate in the presence of potassium carbonate and DMF at 65° C. as shown below to form the compound depicted below.

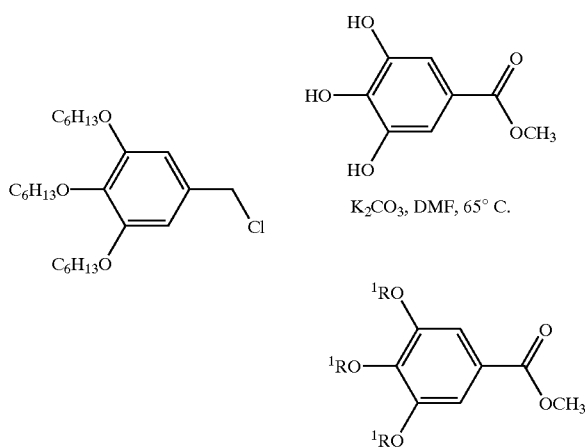

where R[1] is shown below

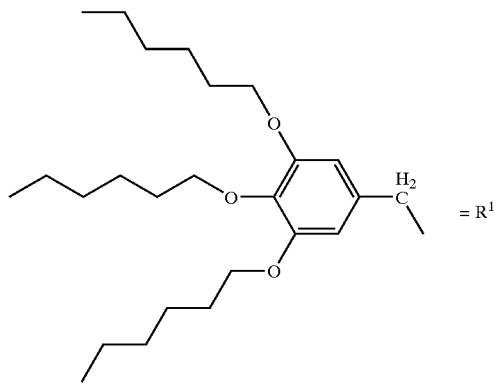

The above compound is then reacted with etherat lithium aluminum hydrate at a temperature of about 0° C. followed by thionyl chloride, dichloromethane, and 2,5-di-tert-butylpyridine at a temperature of about 25° C. to form an intermediate compound as shown below.

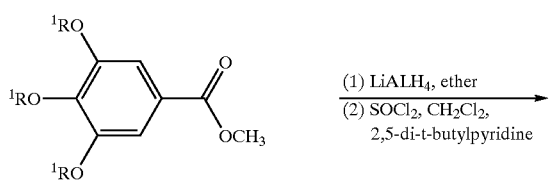

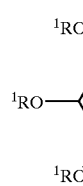

The above compound is reacted with 2,5-diiodo hydroquinone in the presence of potassium carbonate and DMF at 65° C. to form monomer2 where R[2] has the formula shown below.

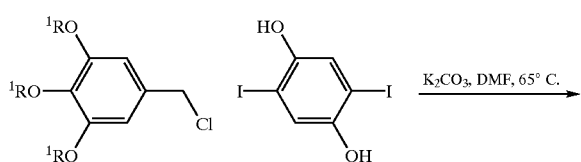

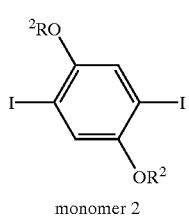

monomer 2 where R[2] is

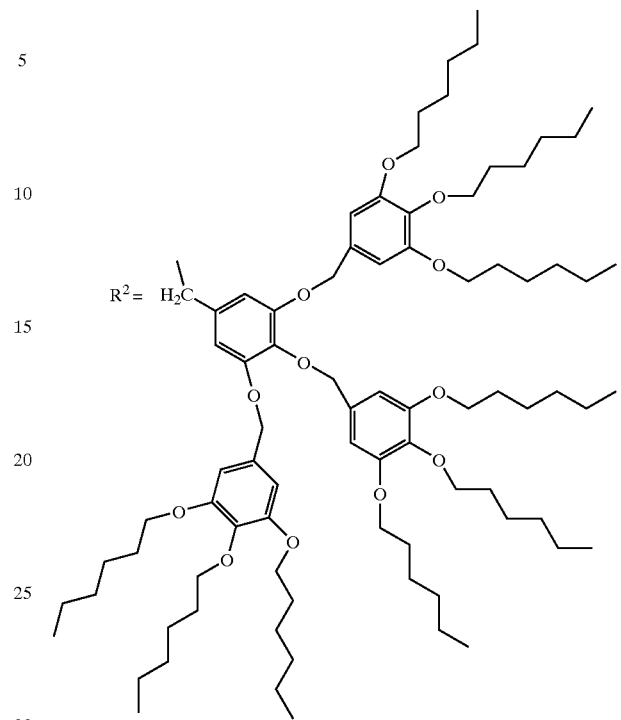

Palladium-catalyzed Heck reactions are again used for the polymerizations. See, Heck, R. F. *Org. React.* 1982. Monomer2 is then reacted with divinyl benzene in the presence of palladium diacetate, POT, triethyl nitrate and DMF at a temperature of about 100° C. to form polymer2 (PPVD2) as shown below

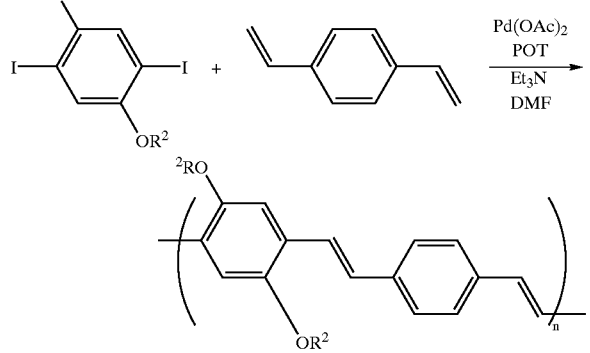

where n is from about 5 to about 25, preferably about 15 and where R[2] is of the formula set forth above. As discussed above, the Heck reaction was previously found to have side-reactions where both the 1 and 2-position of the vinyl group can react with phenyl halides with much lower reactivity at the 2-position. In the present invention, due to this side-reaction the vinyl groups were not visible in $^1$H NMR Subsequent observations of self-ordering and liquid crystalline properties of this polymer indicate that few structural defects exist.

The chemical structures-and syntheses of the polymers are also shown in FIGS. 1 and 2. An elemental analysis found the following results for monomers 1 and 2 and polymers PPVD1 and PPVD2:

| Compound | Molecular formula | Melting Point | Molecular Weight |
|---|---|---|---|
| Monomer 1 | $C_{56}H_{88}I_2O_8$ | 63–66° C. | |
| Monomer 2 | $C_{170}H_{268}O_{26}I_2$ | 73–76° C. | |
| PPVD1 | | | 25,300 Daltons |
| PPVD2 | | | 62,800 Daltons |

An elemental analysis of PPVD1 found C, 77.28%; H, 9.36%. An elemental analysis for PPVD2 found C, 75.49%, H, 9.57%. Physical tests further indicated that PPVD1 had a polydispersity of 2.31 while PPVD2 had a polydispersity of 1.55. These two polymers according to the present invention, namely PPVD1 and PPVD2 as shown in FIGS. 1 and 2, are soluble in common organic solvents such as tetrahydrofuran (THF), chloroform, and toluene. The relative molecular weights of the polymers were determined by Gel Permeation Chromatography (GPC) using THF as eluent and calibrated with polystyrene standards at 35° C. Both PPVD1 and PPVD2 have molecular weights greater than 10,000 Dalton. The absolute molecular weight was also determined for PPVD2 with laser light scattering measurements and was found to be about two times higher than its relative molecular weight as determined by GPC. Thus the polymers according to the present invention have a weight average molecular weight in the range of from about 10,000 to greater than 60,000. The number of repeating units, n, calculated from absolute number-average MW is thus from about 10 to about 25, and most preferably about 15.

Figure 3:
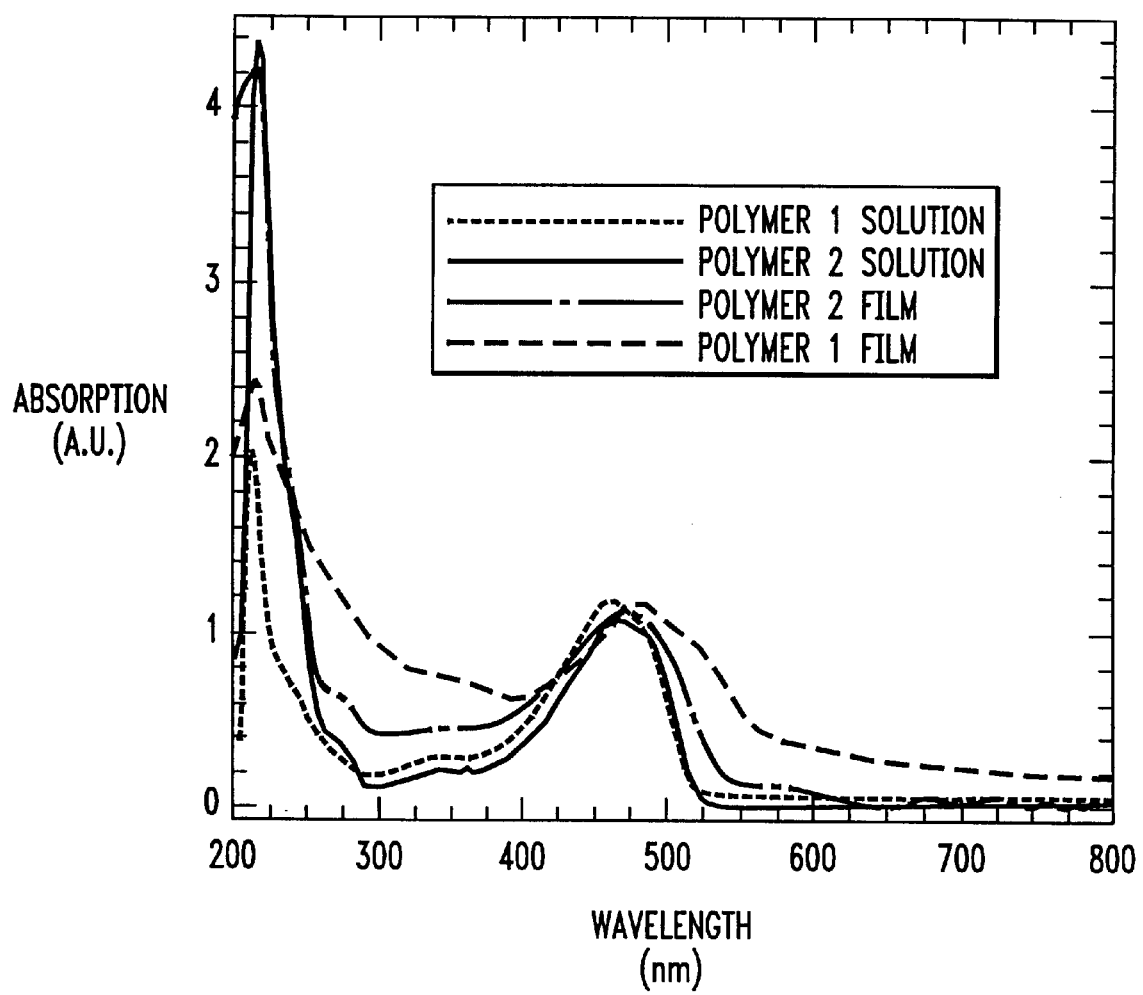
FIG. 3 shows the UV spectra for the polymers of the first and second embodiments of the invention in tetrahydrofuran solutions and in thin films.

Reference is now made to FIG. 3. The UV-absorption spectra were measured for both solutions (in THF) and thin films. PPVD1 and PPVD2 have similar absorption spectra in solution characterized by maximum absorption ($\lambda$max) at around 215 nm, resulting from $\pi$-$\pi$* transition (the difference between the r electrons in a ground state, $\pi$, and the $\pi$ electrons in an excited state, $\pi$*) of isolated phenyl rings from the sidechains, and at 460 nm due to the $\pi$-$\pi$* transition of the PPV backbone. The spectrum of a PPVD2 film prepared from evaporation of the THF solvent has the same $\lambda$max as its solution spectrum but with a slightly broadened absorption linewidth. While not wishing to be bound by theory, it is believed that the fact that $\lambda$max remains unshifted indicates weak interactions between the conjugated backbones in the solid state due to the bulky dendritic sidechains. As compared to PPVD2, the spectrum of the PPVD1 film is red-shifted in THF solution, which is commonly observed for alkyl-substituted PPVs resulting from $\pi$-$\pi$* stacking of the conjugated backbones.

Reference is now made to FIG. 4. X-ray diffraction measurements were performed on films prepared from different solvents. Both polymers were found to self-order with polymer backbones parallel to the substrate and with a strong solvent dependence on the degree of ordering. For a PPVD1 film cast from chloroform at room temperature, a very sharp diffraction peak was found at $2\theta=2.32°$(d=38 Å), where 20 is the angle where the x-ray diffracted pattern signal is detected as determined by Brag's equation. Higher orders were also visible indicating a very high degree of ordering under this condition (FIG. 4A). However, when toluene was used as the solvent and evaporated at about 50° C., a diffuse peak was found at $2\theta=3.35°$–3.55° corresponding to a spacing of 25–26 Å (FIG. 4B). A much narrower and intense diffraction peak at $2\theta=3.55°$ (d=25 Å) was found for a film cast from 1,1,2,2-tetrachloroethane at 50° C. (FIG. 4C). While not wishing to be bound by theory, it is believed that the 25 Å and 38 Å spacings represent the backbone separations for two alternative forms of interdigitation. The 38 Å distance would thus be very reasonable for extended sidechains essentially transverse to the PPV backbone with little or no interdigitation.

Figure 4A:
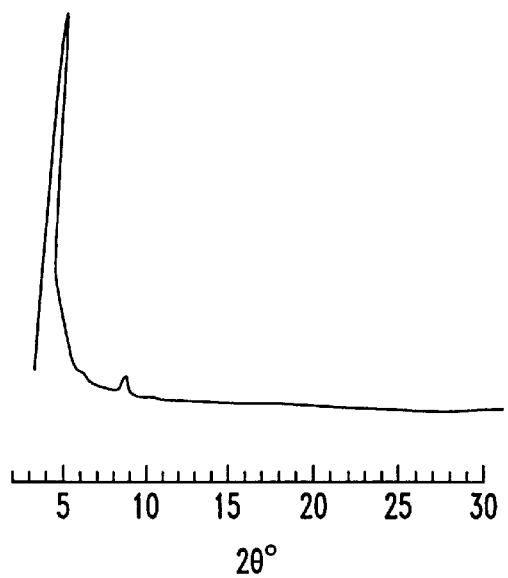
FIG. 4 shows X-ray diffraction patterns for the polymer films of the first and second embodiments of the invention prepared from different solvents.
Figure 4B:
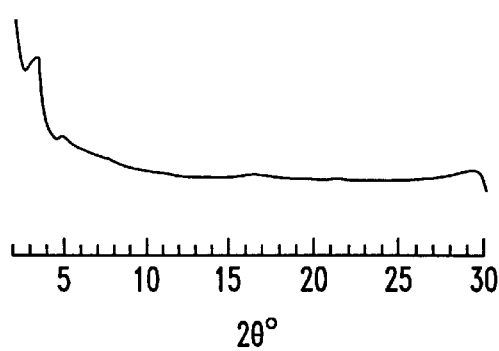
Figure 4C:
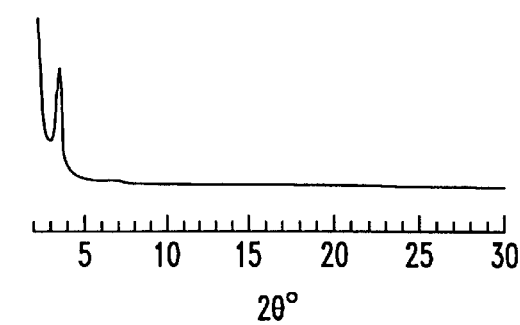
Figure 4D:
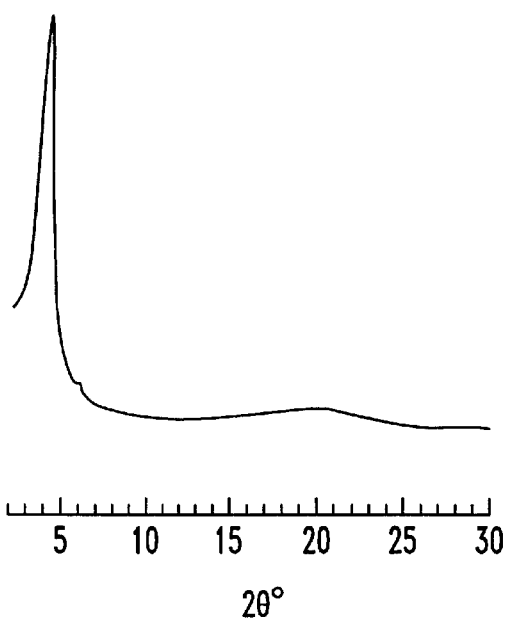
Figure 4E:
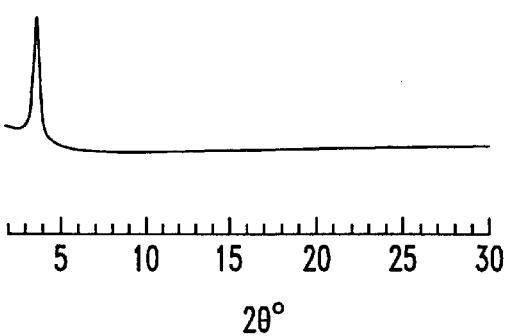
Figure 4F:
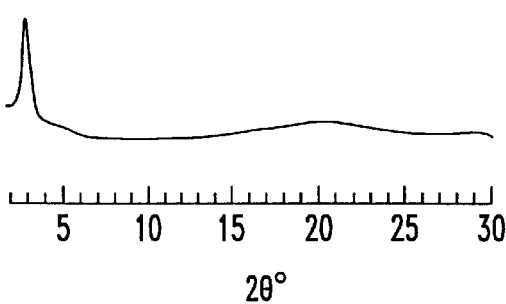
Figure 4G:
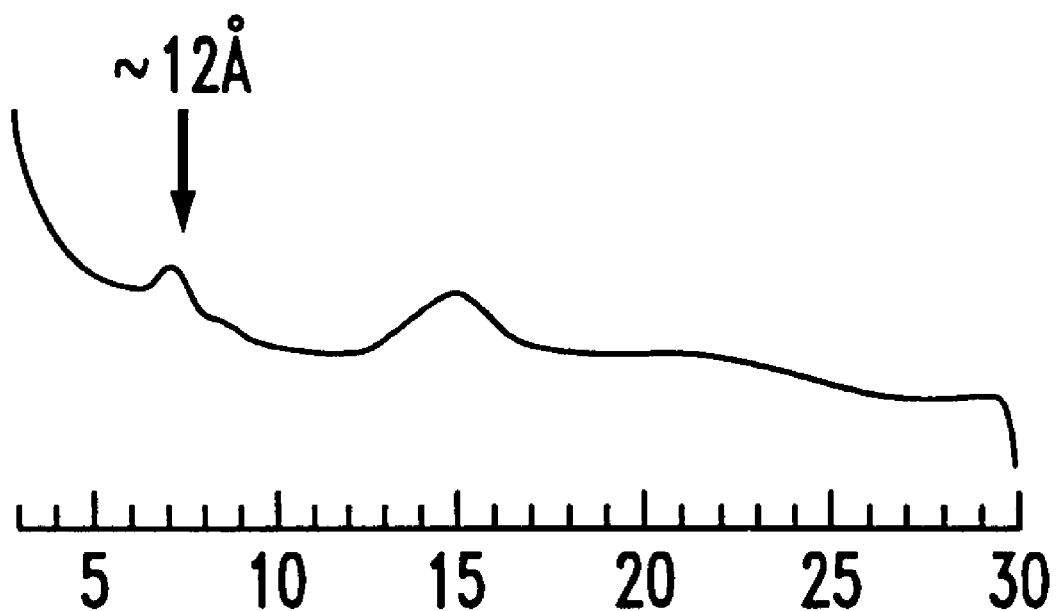

For PPVD2, similar spacings of about 22 to 26 Å were observed for all films prepared from different solvents except that the diffraction peak appeared to broaden for the film prepared from chloroform solution (FIG. 4D) while it was narrower from toluene (FIG. 4E) and 1,1,2,2-tetrachloroethane (FIG. 4F). This spacing corresponds approximately to the radius of the dendritic sidechain; this result therefore indicates that the sidechains of PPVD2 are interdigitated in the solid state. The X-ray diffraction pattern for a diheptoxy-substituted poly (phenylene vinylene) prepared using the same polymerization reaction was also obtained for comparison. However, only diffuse peaks were seen for the film cast from chloroform solution (FIG. 4G). Therefore, the bulky dendritic sidechains appear to be much more effective in promoting self-ordering in the PPV polymer according to the present invention.

Notably, both polymers according to the present invention, PPVD1 and PPVD2, were found to exhibit thermotropic nematic liquid crystal phases. Thin films cast from THF were studied by optical microscopy. Brightness arises from the birefringence of the liquid crystal state, and the numerous thread-like dark lines are typical of the schlieren texture of nematics. To verify that the nematic phase is not related to the solvent used to cast the films, another set of films was spin coated on glass. In the polymers according to the present invention, the solvent evaporates so quickly that the films appear amorphous at room temperature. However, upon heating the films to around 180° C. then cooling, schlieren texture spontaneously forms. This shows that the nematic state is thermodynamically preferred in the absence of solvent. The nematic-to-isotropic transition temperature ($T_{NI}$) was measured on much thicker specimens ($\approx$10–15 $\mu$m) to avoid finite thickness effects and to give a strong birefringence signal. Upon heating, the birefringence fades and the field eventually becomes dark between crossed polarizers. Upon cooling, the birefringence returns. From these observations, the nematic-to-isotropic transition temperatures for the polymers according to the present invention were determined to be about 200±5° C. for PPVD1 and about 211±5° C. for PPVD2. The nematic character of PPV derivatives can thus be exploited in a number of ways to generate strongly aligned films, resulting in enhanced photoconductivity and better charge transport capability, as well as polarized light emission. For example, the polymers according to the present invention can be strongly aligned by deformation. After a thin film of either material is sheared, it exhibits a persistent birefringence with few defects. This reflects a high degree of polymer chain alignment.

Among conjugated polymers, liquid crystallinity is common for the "hairy rod" polymers, which have rigid backbones and flexible sidechains. The dendritic sidechain polymers according to the present invention are also internally flexible. However, compared to linear alkyl chains, they are much bulkier and the resulting interchain packings are expected to be more sensitive to their spatial shapes.

In another embodiment of the present invention, conjugated dendritic PPV polymer-based electroluminescent devices are prepared on a substrate. The substrate is preferably transparent and nonconducting. The substrate can be a rigid material such as a rigid plastic including rigid acrylates, carbonates, and the like, or rigid inorganic oxides such as glass, quartz, sapphire, and the like. The substrate can also be a flexible transparent organic polymer such as polyester—for example polyethyleneterephthalate, flexible polycarbonate, poly (methyl methacrylate), poly(styrene) and the like. The thickness of this substrate is not critical. In the device of the present invention, the conjugated polymer is a poly (phenylene vinylene) [PPV] having dendritic sidechains as set forth herein. A first charge injecting contact layer is a thin layer of aluminum, one surface having a thin oxide layer. The first surface of the semiconducting layer is in contact with the oxide layer. The second charge injecting contact layer is a thin layer of aluminum or gold to form an electroluminescent device.

The present invention relates to new poly(phenylene vinylene) substituted with dendritic sidechains. These polymers are self-ordering polymers in the solid state and yield thermotropic nematic phases. It is to be understood, however, that the invention has broader applicability and includes electroluminescent devices including mixtures of the polymers of the present invention with known electroluminescent polymers. Similarly, the process described above is but one method of many that could be used to fabricate the polymers according to the present invention.

Thus, the present invention provides a new poly (phenylene vinylene) having dendritic sidechains and a method for preparing the same. It should again be noted that although the invention has been described with specific reference to particular poly (phenylene vinylene) polymers and particular dendritic sidechains, the invention has broader applicability and may include electroluminescent devices including mixtures of the polymers of the present invention and other polymers in any electroluminescent device, such as a light emitting diode, or the like. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A method for forming a compound having a repeating unit of the formula:

said method comprising:

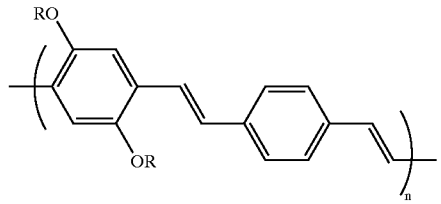

reacting a monomer having the formula:

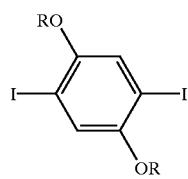

with a divinyl benzene to form said compound, where R is independently selected from of the group consisting of $R^1$, $R^2$, $R^3$ and methyl, provided that at least one R group is $R^1$, $R^2$ or $R^3$, wherein $R^1$ is a substituent of the formula:

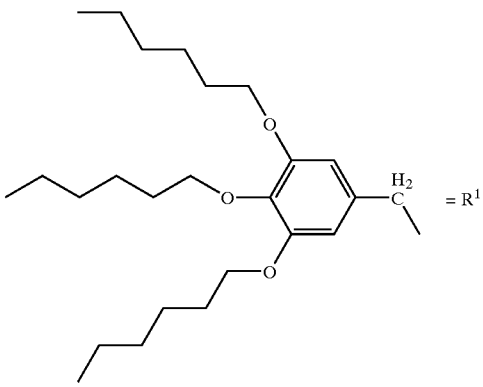

and $R^2$ is a substituent of the formula:

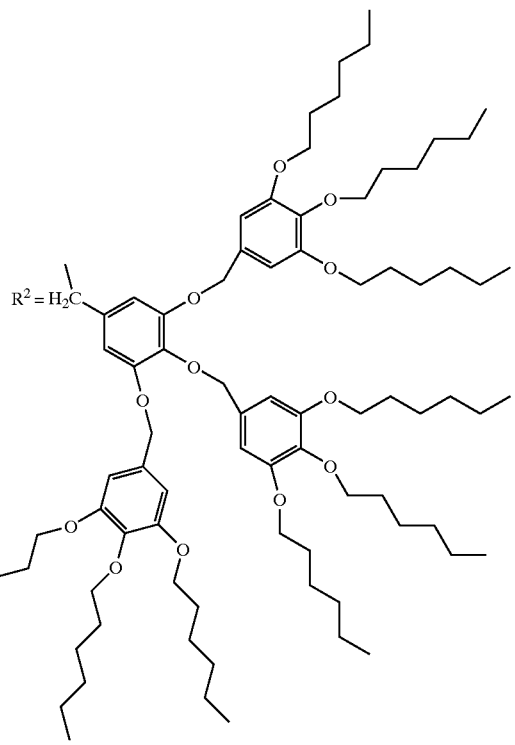

and $R^3$ is a substituent of the formula:

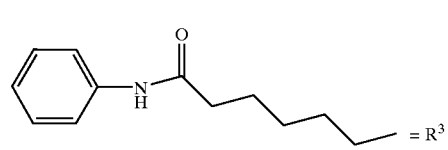

and where n is an integer from about 5 to about 25.

2. The method according to claim 1, wherein n is from about 10 to about 20.

3. The method according to claim 1, wherein n is about 15.

4. The compound according to claim 1, wherein the compound has a molecular weight greater than 10,000 Daltons.

5. The compound according to claim 1, wherein the compound has a molecular weight of from about 20,000 to about 60,000 Daltons.

6. The method according to claim 1, where R is $R^1$.

7. The method according to claim 6, wherein n is from about 10 to about 20.

8. The method according to claim 6, wherein n is about 15.

9. The compound according to claim 6, wherein the compound has a molecular weight greater than 10,000 Daltons.

10. The compound according to claim 6, wherein the compound has a molecular weight of from about 20,000 to about 60,000 Daltons.

11. The method according to claim 1, where R is $R^2$.

12. The method according to claim 11, wherein n is from about 10 to about 20.

13. The method according to claim 11, wherein n is about 15.

14. The method according to claim 11, wherein the compound has a molecular weight greater than 10,000 Daltons.

15. The method according to claim 11, wherein the compound has a molecular weight of from about 20,000 to about 60,000 Daltons.

16. The method according to claim 1, wherein said compound is formed by Paladium catalyzed polymerization.

17. The method according to claim 1, wherein said compound is formed by Paladium catalyzed polymerization.

18. The method according to claim 11, wherein said compound is formed by Paladium catalyzed polymerization.

19. A method for forming a compound having a repeating unit of the formula:

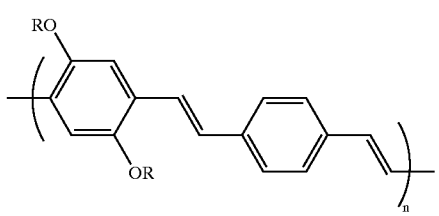

said method comprising:
reacting a monomer having the formula:

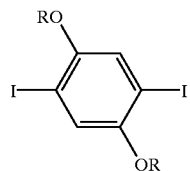

with a divinyl benzene to form said compound,
where R is independently selected from of the group consisting of $R^1$, $R^2$, $R^3$ and methyl, provided that at least one R group is $R^1$, $R^2$ or $R^3$, wherein $R^1$ is a substituent of the formula:

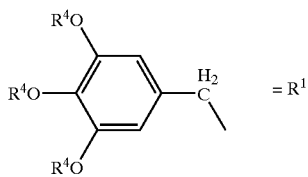

and $R^2$ is a substituent of the formula:

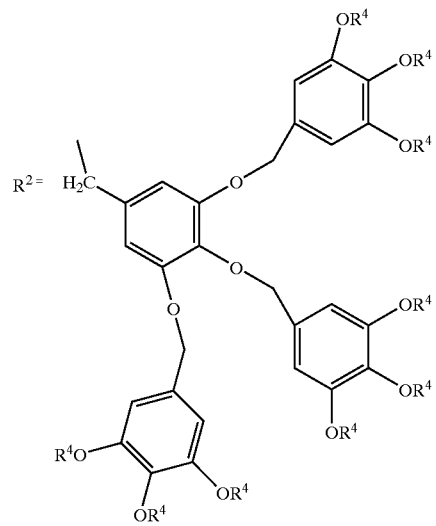

and $R^3$ is a substituent of the formula:

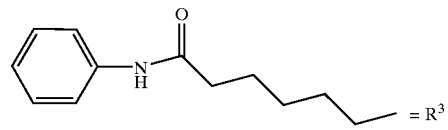

where n is an integer from about 5 to about 25 and $R^4$ is independently selected from a $C_2$–$C_{18}$ alkyl group.

20. The method according to claim 19, wherein n is from about 10 to about 20.

21. The method according to claim 19, wherein n is about 15.

22. The compound according to claim 19, wherein the compound has a molecular weight greater than 10,000 Daltons.

23. The compound according to claim 19, wherein the compound has a molecular weight of from about 20,000 to about 60,000 Daltons.

24. The method according to claim 19, wherein said monomer is reacted with said divinyl benzene to form a symmetrical polymer.

25. The method according to claim 19, wherein said monomer is reacted with said divinyl benzene to form an asymmetrical polymer.

26. The method according to claim 19, where the monomer includes $R^1$ from about 10 to about 90% and includes $R^2$ from about 90 to about 10%.

27. The method according to claim 19, where the monomer includes $R^1$ from about 10 to about 90% and includes $R^3$ from about 90 to about 10%.

28. The method according to claim 19, where the monomer includes $R^2$ from about 10 to about 90% and includes $R^3$ from about 90 to about 10%.

29. The compound according to claim 19, wherein $R^4$ is a $C_6$–$C_{12}$ alkyl group.

30. The compound according to claim 26, wherein $R^4$ is a $C_6$ alkyl group.

31. The compound according to claim 26, wherein $R^4$ is a $C_{12}$ alkyl group.

32. The compound according to claim 27, wherein $R^4$ is a $C_6$–$C_{12}$ alkyl group.

33. The compound according to claim 27, wherein $R^4$ is a $C_6$ alkyl group.

34. The compound according to claim 27, wherein $R^4$ is a $C_{12}$ alkyl group.

35. The compound according to claim 28, wherein $R^4$ is a $C_6$–$C_{12}$ alkyl group.

36. The compound according to claim 28, wherein $R^4$ is a $C_6$ alkyl group.

37. The compound according to claim 28, wherein $R^4$ is a $C_{12}$ alkyl group.

* * * * *